United States Patent [19]

Dep

[11] 4,404,615
[45] Sep. 13, 1983

[54] ANTI-STATIC CONTAINER FOR ELECTRONIC COMPONENTS

[75] Inventor: Barry Dep, Castro Valley, Calif.

[73] Assignee: United Plastics, Corp., Oakland, Calif.

[21] Appl. No.: 330,432

[22] Filed: Dec. 14, 1981

[51] Int. Cl.³ .............................................. H05F 3/02
[52] U.S. Cl. ................................... 361/212; 206/334; 206/328
[58] Field of Search .............. 361/212, 397, 399, 415, 361/425; 206/334, 332, 329, 328; 220/400; 174/32, 35 R, 51

[56] References Cited

U.S. PATENT DOCUMENTS 4,308,953  1/1982  Cohen ................................ 206/334

FOREIGN PATENT DOCUMENTS 2653269  6/1978  Fed. Rep. of Germany ...... 206/334
2023096 12/1979  United Kingdom ................ 206/328
2023102 12/1979  United Kingdom ................ 206/328

OTHER PUBLICATIONS

Velostat Sales Catalog.

Primary Examiner—Harry E. Moose, Jr.
Attorney, Agent, or Firm—Harris Zimmerman; Howard Cohen

[57] ABSTRACT

An anti-static container for electronic circuit boards and the like includes a generally rectangular box having opposed end walls, opposed side walls, a bottom panel extending therebetween, and an open top. Disposed within the box is a liner formed of an anti-static substance. The liner is generally co-extensive with the bottom panel, and includes side portions which impinge upon the lower portions of the side walls. The side portions include slots for supporting a plurality of circuit boards on edge in upwardly extending fashion. Conductive rivets or lugs extend through the bottom panel of the box to connect the liner with an external ground plane, so that static charges cannot accumulate or be imparted to the circuit boards within the box.

6 Claims, 11 Drawing Figures

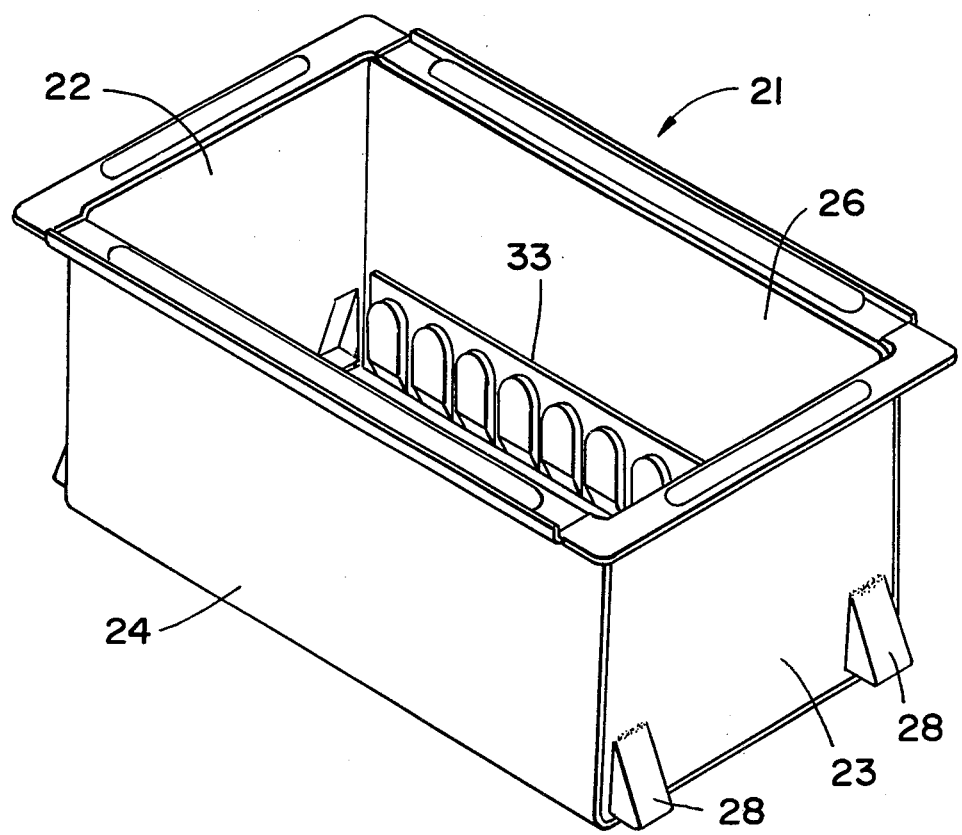
FIG_1
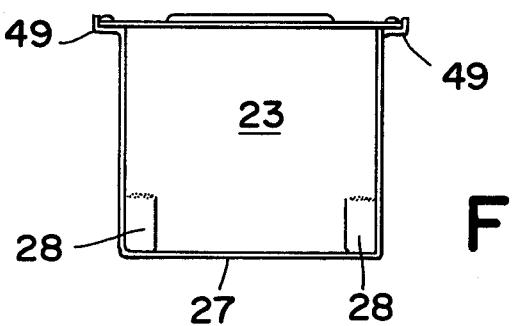
FIG_2
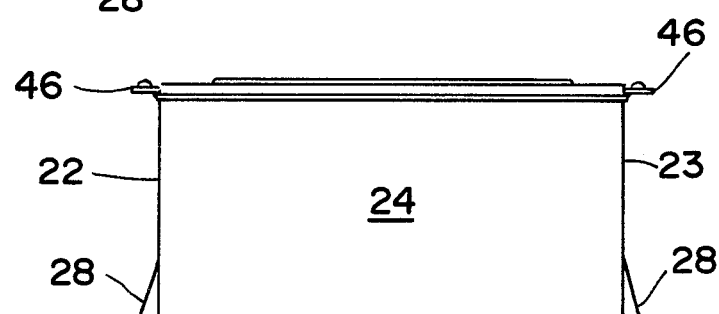
FIG_3

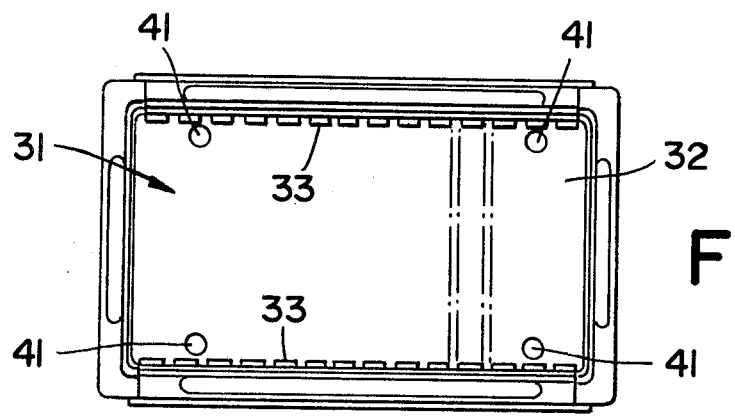
FIG_4
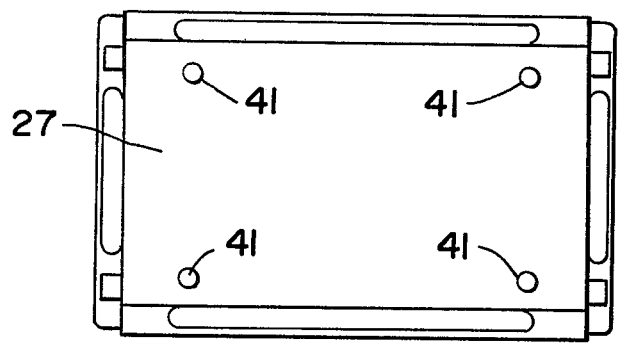
FIG_5
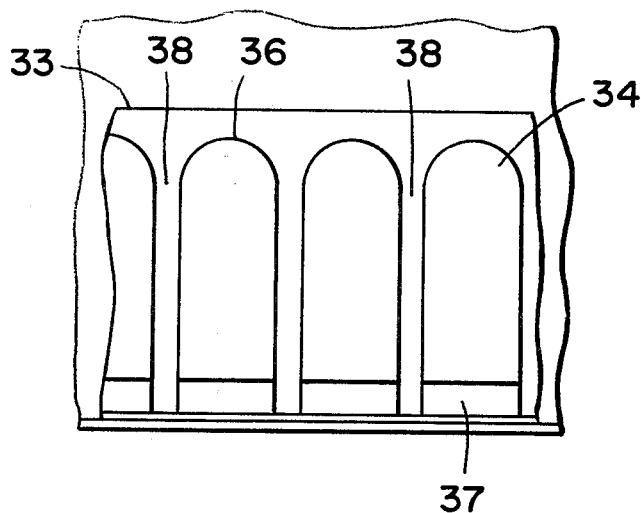
FIG_6

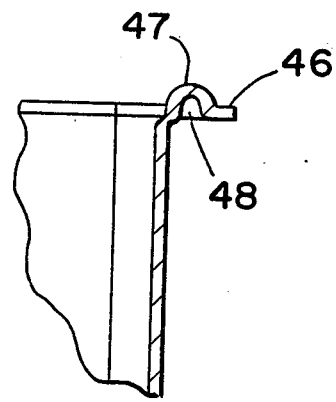
FIG _ 10
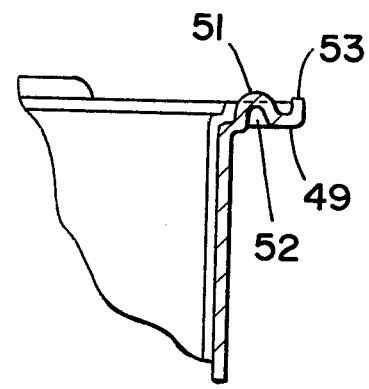
FIG _ 11
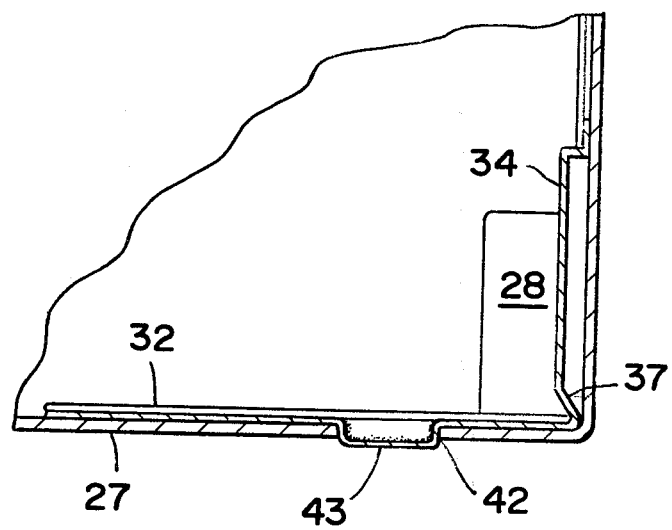
FIG _ 7
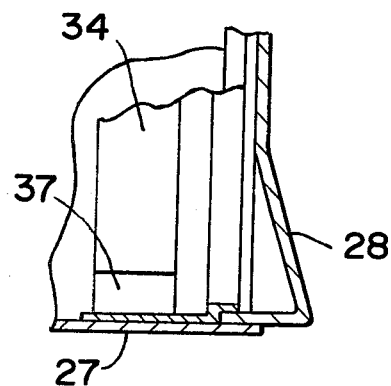
FIG _ 8
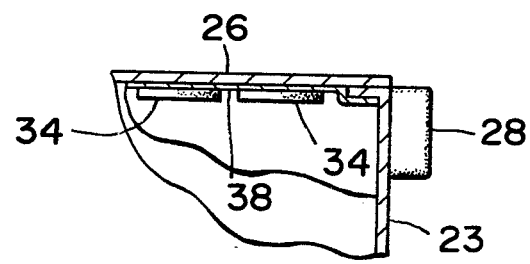
FIG _ 9

ANTI-STATIC CONTAINER FOR ELECTRONIC COMPONENTS

BACKGROUND OF THE INVENTION

In recent years, great progress has been made in the field of micro-electronics. Since the advent of integrated circuits and large scale integrated circuits, the performance and capabilities of electronic components have increased enormously. As line width and design rule dimensions have decreased, the number of active elements formed on an integrated circuit chip have increased and the memory density, through-put, and speed of integrated circuit logic components have also increased.

An unfortunate side effect of the shrinking geometries of components on integrated circuit chips is that the components can be extremely sensitive to voltages or currents which are greater than the design specifications. Although assembled components can be protected from static electricity by proper design of circuitry in which the components are used, it has been found that integrated circuit components often may be damaged during production, testing, and other handling, by static electric charges. A static charge which is caused by an individual walking on a wool carpet or the like easily may exceed one thousand volts; an integrated circuit component which is designed for operation at five volts and has a capacitance in the femtofarad range cannot withstand a surge of this magnitude. Static charges have been identified as a significant quality control problem, especially for devices such as field effect transistors which are extremely sensitive to overvoltages.

New packaging techniques have been developed for components which are sensitive to static electricity. For example, such components are often packaged in envelopes which are conductive, so that no static charge may accumulate therein. However, serious quality control problems still exist in the production and testing of electronic components.

SUMMARY OF THE PRESENT INVENTION

The present invention generally comprises a container for storing and transporting a plurality of electronic circuit boards during production, testing, and the like. A salient feature of the container of the present invention is the provision of a liner therein which is anti-static and connected to ground. The liner prevents the accumulation of any static charges near the circuit boards within the container, thus alleviating damage to components due to static electricity during manufacturing and testing.

The anti-static container for electronic circuit boards and the like includes a generally rectangular box having opposed end walls, opposed side walls, a bottom panel extending therebetween, and an open top. Disposed within the box is a liner formed of an anti-static substance. The liner is generally co-extensive with the bottom panel, and includes side portions which impinge upon the lower portions of the side walls. The side portions include slots for supporting a plurality of circuit boards on edge. Conductive rivets or lugs extend through the bottom panel of the box to connect the liner with an external ground plane, so that static charges cannot accumulate or be imparted to the circuit boards within the box.

BRIEF DESCRIPTION OF THE DRAWING

FIG. 1 is a perspective view of the container of the present invention.

FIG. 2 is an end elevation of the container of the present invention.

FIG. 3 is a side elevation of the container of the present invention.

FIG. 4 is a top plan view of the container of the present invention.

FIG. 5 is a bottom plan view of the container of the present invention.

FIG. 6 is an enlarged side elevation of the liner portion of the present invention.

FIG. 7 is a detailed cross-sectional elevation of the assembly of the liner and the container of the present invention.

FIG. 8 is an enlarged cross-sectional elevation of a corner assembly of the present invention.

FIG. 9 is a detailed cross-sectional top view of a corner of the container of the present invention.

FIG. 10 is a detailed cross-sectional elevation of an end flange of the present invention.

FIG. 11 is a detailed cross-sectional elevation of a side flange of the container of the present invention.

DESCRIPTION OF THE PREFERRED EMBODIMENT

With reference to FIGS. 1-3, the present invention generally comprises a container 21 which is adapted to support a plurality of electronic circuit boards therein. The container 21 is generally rectangular in configuration, including a pair of opposed, parallel end walls 22 and 23, and a pair of opposed, parallel side walls 24 and 26 extending orthogonally between the end walls. A bottom panel 27 extends continuously between the opposed edges of the end walls and side walls. The top of the container is open.

Extending outwardly from each of the end walls 22 and 23 are a pair of lugs 28. The lugs 28 are triangular in profile (FIG. 3), and are disposed adjacent to the bottom panel 27 and the side panels 24 and 26. The lugs 28 are provided to establish a minimum distance between containers 21 which are disposed with their end walls in adjacent relationship.

A salient feature of the present invention is the provision of an anti-static liner 31 within the container 21, as shown for example in FIG. 4. The anti-static liner 31 includes a bottom panel 32 which is generally coextensive with and impinging on the bottom panel 27 of the container. The anti-static liner 31 also includes side portions 33 which extend upwardly from opposed side edges of the bottom panel 32 and impinge upon lower portions of the side walls 24 and 26 of the container.

With reference to FIG. 6, the side portions 33 of the anti-static liner include a plurality of bosses 34 spaced longitudinally therealong and extending inwardly into the container 21. The bosses 34 include arcuate upper ends 36 and lower bevelled portions 37 which extend obliquely toward the side walls of the container. The bosses 34 define therebetween a plurality of slots 38. The slots 38 are adapted to engage edge portions of electronic circuit boards, printed circuit boards, and the like. The slots 38 support the circuit boards arrayed in vertically disposed, horizontally spaced relationship, as shown in phantom line in FIG. 4. The rounded ends 36 aid in guiding the circuit board edges into the slots 38.

The anti-static liner 31 of the present invention is formed of an anti-static material which is sufficiently conductive to quickly bleed away static charges, whereas the container 21 may be formed of any common structural material such as corrugated sheet metal, plastic, fiberboard, and the like. Indeed, similar containers known in the prior art are usually formed from an electrically insulative substance, in accordance with accepted safety practices in electronic assembly areas. The conductive material of the anti-static liner may comprise a conductive polypropylene plastic formulation known in the prior art. Such material is not only too expensive to be used to fabricate an entire container, but it lacks the structural strength to form a sufficiently rigid container.

In order for the anti-static material of the liner 31 to provide anti-static protection, it is necessary to connect the liner 31 to electrical ground potential. This may be accomplished by the provision of a plurality of metal rivets 41 extending through both of the bottom panels of the liner 31 and the container 21. The container 21 may be placed on a grounded conductive surface so that the rivets 41 make contact therewith and ground the liner 31 to the grounded surface. Grounding of the liner 31 prevents any static charges from accumulating thereon or in the electronic circuit boards supported thereby.

Alternatively, the bottom panel 27 of the container may be provided with a plurality of holes 42 extending therethrough. As shown in another embodiment in FIG. 7, the liner 31 includes a plurality of lugs 43 extending downwardly from the bottom panel 32 and disposed to extend through the holes 42 of the bottom panel 27. When the container as shown in FIG. 7 is supported on a grounded surface, the lugs 43 will impinge upon the grounded surface and form a conductive contact therewith to ground the anti-static liner.

With reference to FIG. 10, both of the end walls 22 and 23 include a flange 46 extending generally orthogonally outwardly from the upper extent of the end walls. The flange 46 includes a convex boss 47 extending therealong and defining a concave fingerhold recess 48 on the underside of the flange 46. The fingerhold 48 facilitates manual grasping of the flanges 46 for transport of the containers 21.

Likewise, the side walls 24 and 26 of the container 21 each include a flange 49 extending generally orthogonally outwardly from the upper edges thereof. The flanges 49 each include an arcuate boss 51 extending convexly upwardly from the flange and defining a concave fingerhold space 52 on the underside of the flange 49. In addition, the distal edge of the flange 49 includes an upwardly extending lip 53. The lip 53 is provided to abut a similar lip extending from the side wall of an adjacent container 21. The lips 53 prevent the flanges 49 of adjacent containers from riding up one over the other and possibly causing the rivets 41 or lugs 43 from breaking contact with the ground plane on which the containers are supported.

It may be appreciated that the members 28 extend outwardly from the end walls 22 and 23 approximately the same distance as the flanges 46 extend outwardly therefrom, as shown in FIG. 2. Thus the members 28 maintain proper spacing of containers which are disposed with end walls in adjacent relationship, so that the flanges 46 cannot accidentally ride up one over the other.

It may be further appreciated that the container 21 may be used to store and transport electronic circuit boards during manufacturing, testing, and packaging thereof. The container of the present invention not only eliminates damage due to static electric charges, but also minimizes the handling required of each electronic circuit board supported therein. That is, the container of the present invention permits the movement of a large number of circuit boards at one time, with no manual contact therewith.

I claim:

1. An anti-static device for supporting a plurality of electronic circuit boards, comprising; a container dimensioned to receive said plurality of circuit boards, liner means disposed within said container, said liner means formed of an anti-static material, said liner means comprising a liner having a bottom panel and side portions extending upwardly from opposed edges of said bottom panel, slot means formed in said liner to receive and support edge portions of said circuit boards in upwardly extending fashion, and means for connecting said liner to ground potential.

2. The device of claim 1, wherein said slot means include a plurality of slots formed in said side portions.

3. The device of claim 2, wherein said side portions include a plurality of bosses protruding therefrom and extending inwardly from said side portions, each adjacent pair of said bosses defining therebetween one of said slots.

4. The device of claim 1, wherein said means for connecting said liner means to ground potential includes at least one conductor extending from said bottom panel through the bottom of said container.

5. The device of claim 4, wherein said at least one conductor comprises a lug formed in said bottom panel and extending downwardly therefrom.

6. The device of claim 5, further including at least one hole formed in said bottom of said container and adapted to receive said lug therethrough.

* * * * *